(12) United States Patent
Zhang et al.

(10) Patent No.: US 10,122,292 B2
(45) Date of Patent: Nov. 6, 2018

(54) CONVERTER VALVE

(71) Applicants: NR ELECTRIC CO., LTD, Jiangsu (CN); NR ENGINEERING CO., LTD, Jiangsu (CN); NR ELECTRIC POWER ELECTRONICS CO., LTD., Jiangsu (CN)

(72) Inventors: Xiang Zhang, Jiangsu (CN); Lei Liu, Jiangsu (CN); Taixun Fang, Jiangsu (CN); Chihan Chen, Jiangsu (CN); Zhao Li, Jiangsu (CN); Haiying Li, Jiangsu (CN); Fengfeng Ding, Jiangsu (CN)

(73) Assignees: NR ELECTRIC CO., LTD, Jiangsu (CN); NR ENGINEERING CO., LTD, Jiangsu (CN); NR ELECTRIC POWER ELECTRONICS CO., LTD., Jiangsu (CN)

( * ) Notice: Subject to any disclaimer, the term of this patent is extended or adjusted under 35 U.S.C. 154(b) by 0 days.

(21) Appl. No.: 15/573,837

(22) PCT Filed: Jul. 13, 2016

(86) PCT No.: PCT/CN2016/089948
§ 371 (c)(1),
(2) Date: Nov. 14, 2017

(87) PCT Pub. No.: WO2016/188504
PCT Pub. Date: Dec. 1, 2016

(65) Prior Publication Data
US 2018/0262120 A1 Sep. 13, 2018

(30) Foreign Application Priority Data

May 28, 2015 (CN) .......................... 2015 1 0283868
May 28, 2015 (CN) .......................... 2015 1 0284795

(51) Int. Cl.
H02M 7/00 (2006.01)

(52) U.S. Cl.
CPC .................................. *H02M 7/003* (2013.01)

(58) Field of Classification Search
None
See application file for complete search history.

(56) References Cited

U.S. PATENT DOCUMENTS

2009/0174974 A1* 7/2009 Huang ................... H05K 3/403
361/56
2011/0310523 A1* 12/2011 Hedblad ............... H01L 23/473
361/212

(Continued)

FOREIGN PATENT DOCUMENTS

CN 103354235 10/2013
CN 103354425 10/2013

(Continued)

OTHER PUBLICATIONS

"International Search Report (Form PCT/ISA/210)", dated Oct. 13, 2016, with English translation thereof, pp. 1-6.

Primary Examiner — Jeffrey A Gblende
(74) Attorney, Agent, or Firm — JCIPRNET

(57) ABSTRACT

A converter valve includes a top shielding cover, a bottom shielding cover, at least two vertically stacked valve layers, and a maintenance platform. The top shielding cover is disposed at an upper portion of an uppermost valve layer. The bottom shielding cover is disposed at a lower portion of a lowermost valve layer. Each of the valve layers comprises two valve modules disposed side-by-side in a horizontal direction. The two valve modules are electrically connected via a busbar and mechanically connected via securing connectors. A lower valve layer is connected to an upper valve layer in a suspended manner. A body of the maintenance platform is located between horizontal planes on which two (Continued)

vertically adjacent valve layers are located, or between horizontal planes on which the lowermost valve layer and the bottom shielding cover are located.

11 Claims, 4 Drawing Sheets

(56) References Cited

U.S. PATENT DOCUMENTS

2012/0070944 A1* 3/2012 Kim .................... H01L 27/0688
                                                                                         438/128
2014/0321095 A1* 10/2014 Kim .......................... H02J 3/36
                                                                                         361/807

FOREIGN PATENT DOCUMENTS

| CN | 203608094 | 5/2014 |
| CN | 104009651 | 8/2014 |
| CN | 203984257 | 12/2014 |
| CN | 104901515 | 9/2015 |
| CN | 104901559 | 9/2015 |
| JP | H08162609 | 6/1996 |

* cited by examiner

CONVERTER VALVE

CROSS-REFERENCE TO RELATED APPLICATION

This application is a 371 application of the international PCT application serial no. PCT/CN2016/089948, filed on Jul. 13, 2016, which claims the priority benefit of China application no. 201510284795.8, filed on May 28, 2015, and China application no. 201510283868.1, filed on May 28, 2015. The entirety of each of the above-mentioned patent applications is hereby incorporated by reference herein and made a part of this specification.

BACKGROUND OF THE INVENTION

Field of the Invention

The present invention relates to the technical field of power electronics and power systems and, more particularly to a converter valve.

Description of Related Art

A converter valve is a critical component in high voltage direct current transmission (HVDC), and has a relatively bulky physical size. In operation, the converter valve is subjected to a voltage of several hundred kV at both ends, and is in the process of frequent switching on and off. At present, a single commercial power electronics withstands a voltage of up to 8.5 kV. Accordingly, it is necessary to connect dozens of or even nearly one hundred stages of the devices in series. A valve tower generally uses a structure with a plurality of valve layers sequentially stacked from top to bottom and thyristors evenly distributed on respective valve layers.

One valve layer of the converter valve is generally composed of two valve modules. Currently, the two valve modules are connected in a split-level structure or an even-level structure. For a split-level structure arrangement, 16 reinforced epoxy resin rods are required to construct a cage-type frame in space, and then various assemblies are sequentially secured at different locations of this cage-type frame, resulting in a very complicated structure and cumbersome installation and maintenance. In addition, this cage-type frame has relatively poor shock resistance. For an even-level structure arrangement, suspending insulators are used between an upper layer and a lower layer, no connection measures are taken between two assemblies within one valve layer, and the converter valve is configured to be two independent converter valves effectively, resulting in complex installation. In addition, when external forces such as earthquake occur, displacement between valve layers is relatively large, and accordingly, there may exist a relatively large change in distance between two valve modules of the valve layer. The converter valve has a poor integrity.

In addition, a large number of components and devices are included in the valve tower for the converter valve, and it is necessary to take into consideration the convenience for repair and maintenance in later operations during the designing process. At present, there are two main ways in the maintenance of the valve tower for the converter valve. One is to operate directly on a lift truck without a maintenance platform inside the valve tower. This way can merely maintain peripheral devices of the valve tower, and interior devices of the valve tower are difficult to repair in case of failure. The other is to provide a maintenance platform inside the valve tower. The maintenance platform and the valve layer are configured in two main forms. In a first structure, each valve layer consists of two half-layer valves arranged side-by-side in a horizontal direction. The two half-layer valves are securely connected together, a maintenance platform is provided between the half-layer valves, and the maintenance platform is located on the same horizontal plane as the valve layer. Since the maintenance platform is directly connected with both half-layer valves, the maintenance platform must be wide enough in order to meet insulation requirements, which necessarily increases the area of the valve tower. In addition, the maintenance platform is parallel to the valve layer, which is not convenient for operation and maintenance staff to perform the maintenance on devices. In the other structure, each valve layer also consists of two half-layer valves. However, the two half-layer valves are in a split-level configuration, and are not on the same horizontal plane. The maintenance platform is provided at an intermediate location of the two half-layer valves in a vertical direction. The maintenance platform of such a structure has a relatively small width and the insulation requirements are met. However, it is only convenient for maintaining one of the two half-layer valves, but not for the other half-layer valve.

SUMMARY OF THE INVENTION

In order to solve the existing technical problems, an embodiment of the present invention provides a converter valve.

The present invention provides a converter valve, comprising: a top shielding cover, a bottom shielding cover, at least two vertically stacked valve layers, and a maintenance platform. The top shielding cover is disposed at an upper portion of an uppermost valve layer. The bottom shielding cover is disposed at a lower portion of a lowermost valve layer. Each of the valve layers comprises: two valve modules disposed side-by-side in a horizontal direction. The two valve modules are electrically connected via a busbar and mechanically connected via securing connectors. A lower valve layer is connected to an upper valve layer in a suspended manner. A body of the maintenance platform is located between horizontal planes on which two vertically adjacent valve layers are located, or between horizontal planes on which the lowermost valve layer and the bottom shielding cover are located.

The two valve modules are securely connected via a first securing connector and a second securing connector. The first securing connector is composed of an insulating material. The second securing connector is an insulator, or an insulating beam, or a metallic beam.

The first securing connector and the second securing connector are disposed between the two valve modules, respectively, adjacent to two opposite side walls of the converter valve.

The different valve layers are electrically connected, on one side adjacent to the first securing connector, via the busbars; the two valve modules within the same valve layer are electrically connected, on one side adjacent to the second securing connector, via the busbar; and all the valve modules within the different valve layers in the converter valve are electrically connected in series.

The body of the maintenance platform is suspended on frames of two half-layer valves for any valve layer through the insulating material.

The frame of the half-layer valve consists of an inner longitudinal beam, an outer longitudinal beam, and at least two cross beams. The inner longitudinal beam is a frame of one half-layer valve on one side adjacent to the other half-layer valve. The outer longitudinal beam is a frame of one half-layer valve on one side away from the other half-layer valve, and is parallel to the inner longitudinal beam in a horizontal direction. The cross beams are connected between the inner longitudinal beam and the outer longitudinal beam.

The body of the maintenance platform is suspended on the inner longitudinal beams of the two half-layer valves.

At least two cooling water pipes are provided between the different valve layers.

At least two optical cable trays are provided between the different valve layers.

The converter valve provided in the embodiment of the present invention comprises: a top shielding cover, a bottom shielding cover, at least two vertically stacked valve layers, and a maintenance platform. The top shielding cover is disposed at an upper portion of an uppermost valve layer. The bottom shielding cover is disposed at a lower portion of a lowermost valve layer. Each of the valve layers comprises two valve modules disposed side-by-side in a horizontal direction. The two valve modules are electrically connected via a busbar and mechanically connected via securing connectors. A lower valve layer is connected to an upper valve layer in a suspended manner. A body of the maintenance platform is located between horizontal planes on which two vertically adjacent valve layers are located, or between horizontal planes on which the lowermost valve layer and the bottom shielding cover are located. In the converter valve according to the embodiment of the present invention, flexible connections and strong shock resistance are achieved between different valve layers through suspension. The two valve modules in the valve layer are secured as a whole, and the insulating distance is not affected by external forces such as earthquake. The valve layer is installed by hoisting with an overall layer, which facilitates operations. In addition, the maintenance platform is suspended on a lower horizontal plane between the two valve modules through insulators, which decreases the size of the valve tower while satisfying an equal creep distance. Moreover, a height difference between the maintenance platform and the valve layer facilitates maintenance of devices on the valve layer by operation and maintenance staff.

BRIEF DESCRIPTION OF THE DRAWINGS

In the drawings (which are not necessarily to scale), similar reference numerals can be used to describe similar components in different views. Similar reference numerals with different alphabetic suffixes may represent different examples of similar components. Various embodiments discussed herein are generally shown in the drawing by way of illustration rather than limitation.

DETAILED DESCRIPTION OF THE INVENTION

The present invention is further illustrated in detail below with reference to particular embodiments and the accompanying drawings.

Figure 1:
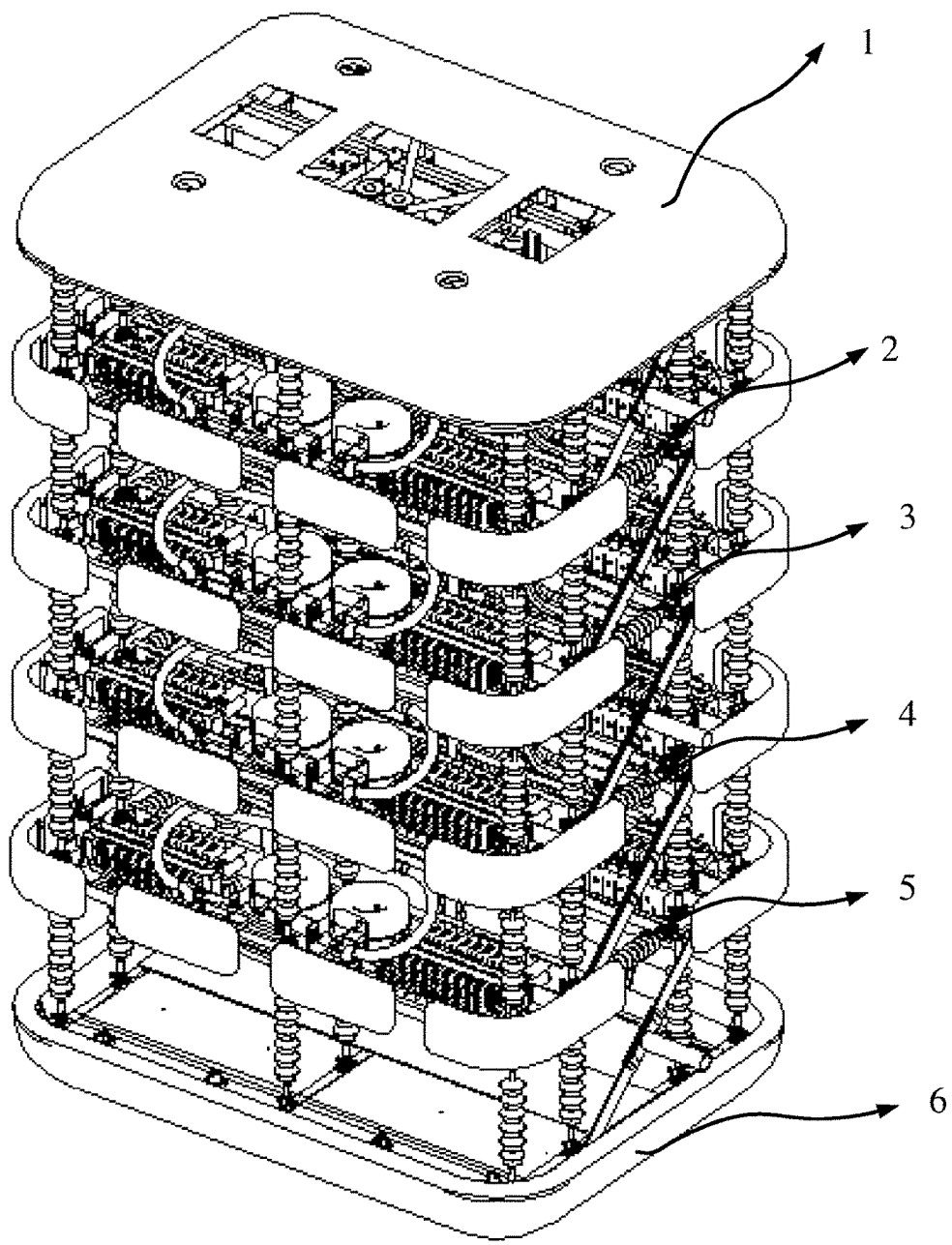
FIG. 1 is a schematic diagram of the overall structure of the converter valve in an application scenario according to an embodiment of the present invention.

As shown in FIG. 1, in the application scenario, the converter valve consists of four vertically stacked valve layer 2-5 with a shielding cover 1 disposed on a top portion thereof and a shielding cover 6 disposed on a bottom portion thereof. The shielding cover plays a critical role in improving electric field distribution in a high voltage electric field.

Figure 3:
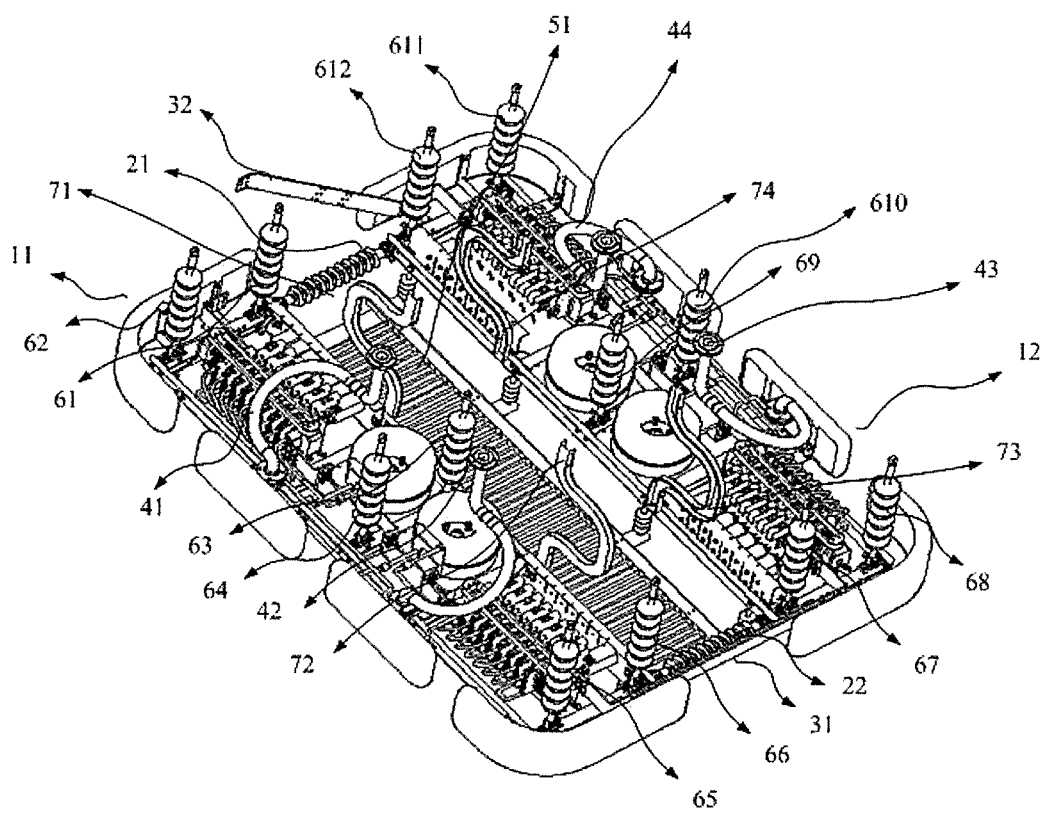
FIG. 3 is a structural schematic diagram of a single valve layer in the converter valve in an application scenario according to an embodiment of the present invention.

As shown in FIG. 3, an upper valve layer and a lower valve layer in the converter valve are connected in a suspended manner using twelve insulators 61, 62, 63, 64, 65, 66, 67, 68, 69, 610, 611, 612. Having suspended the valve layers using the insulators, the entire converter valve constitutes a flexible system from top to bottom. The valve layers can swing within a certain range without the overall structure being damaged when being subjected to strong external forces such as earthquake. The converter valve can continue to operate after strong external forces such as earthquake disappear.

Figure 2:
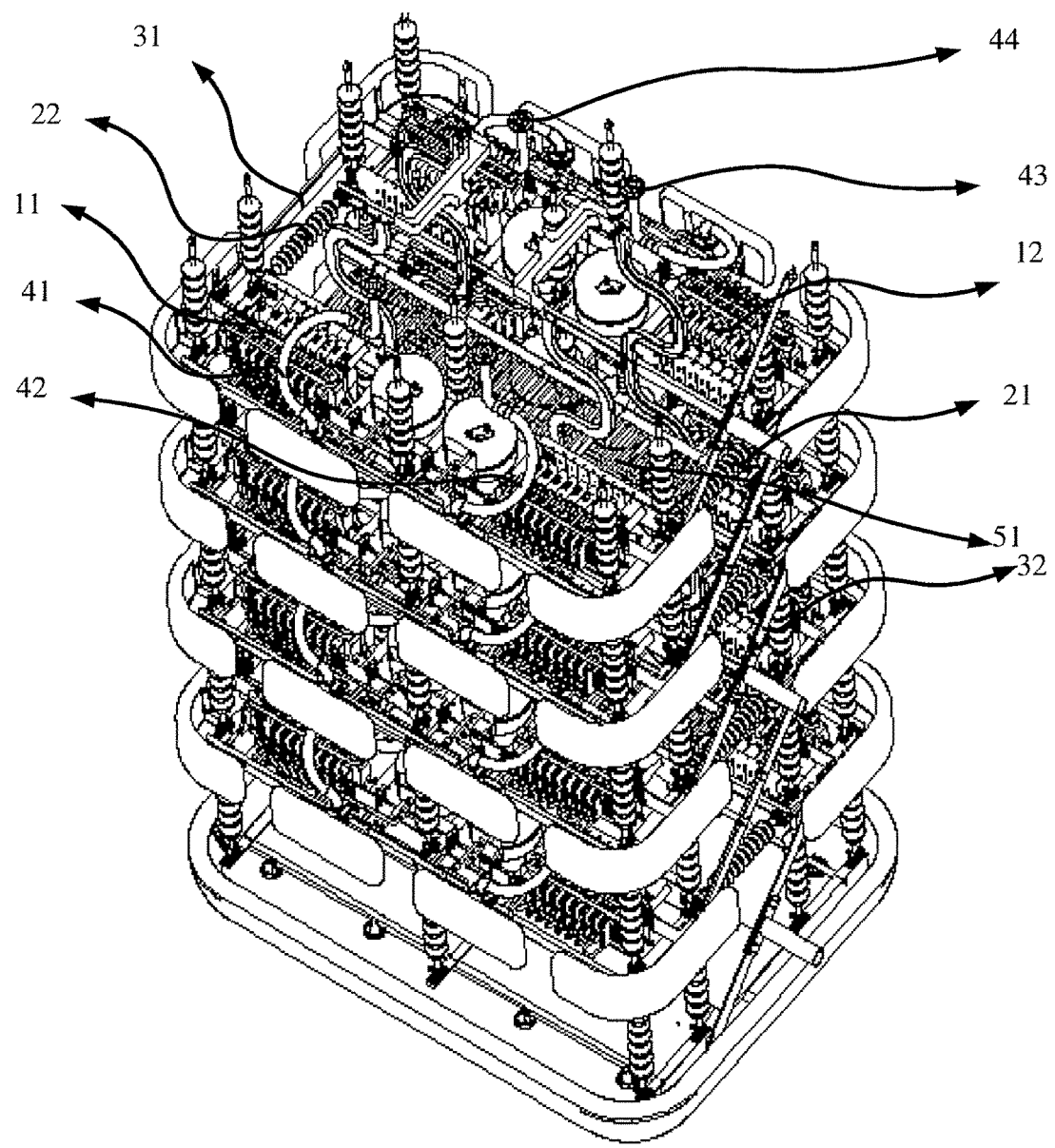
FIG. 2 is a structural schematic diagram of the converter valve with a top shielding cover removed in an application scenario according to an embodiment of the present invention.
Figure 4:
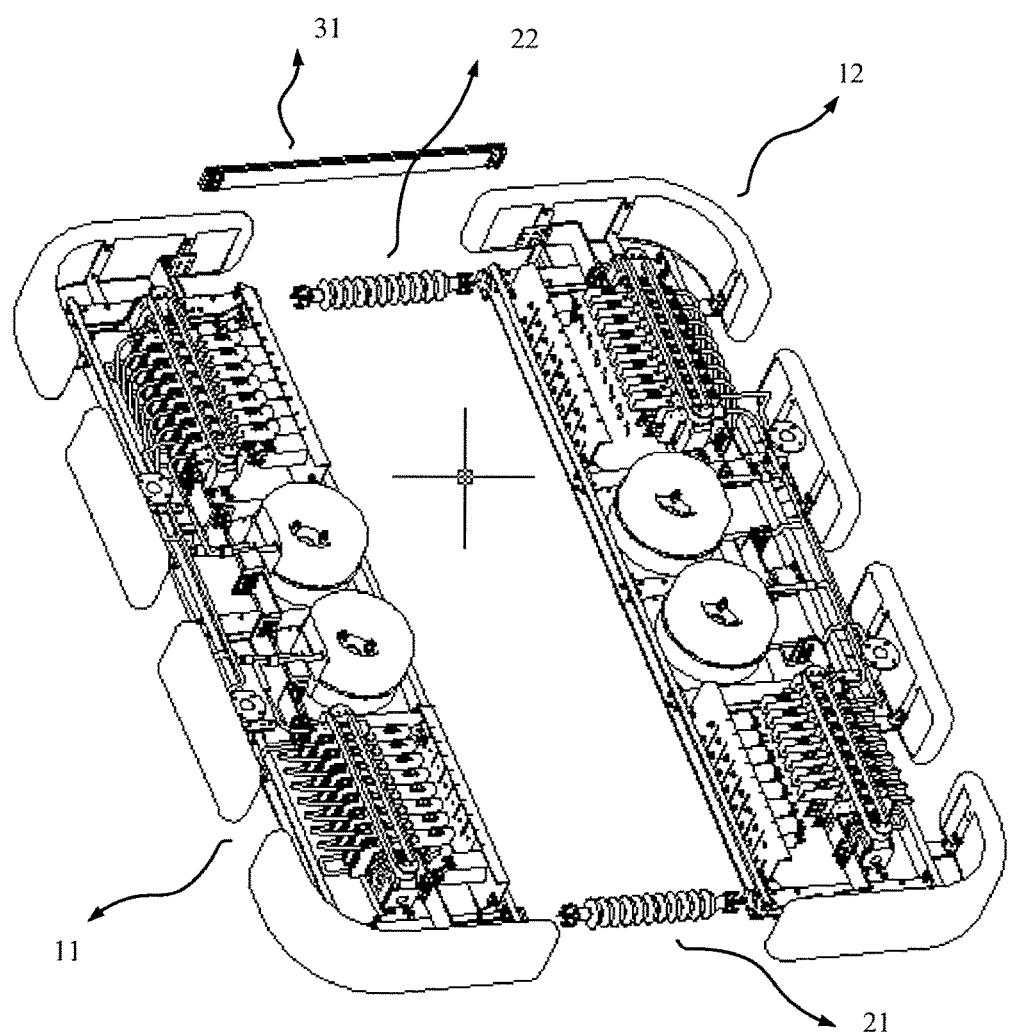
FIG. 4 is a schematic diagram of a connection of two valve modules in the single valve layer in an application scenario according to an embodiment of the present invention.

As shown in FIG. 3 and FIG. 4, in order to enable all the valve modules in the converter valve to be electrically connected in series, a single valve layer is arranged with two valve modules 11, 12 disposed side-by-side. The two valve modules are, on one side, shorted with a busbar 31 so as to form the electrical connection between the two valve modules, and interconnected to increase the mechanical strength with a securing connector 22, such as an insulator, an insulating beam, or a steel beam. The two valve modules are, on the other side, separated so as to form a U-shaped arrangement. The valve modules are subjected to a very high voltage when the converter valve is in operation. The U-shaped opening side therefore requires a certain insulating distance, and in order to minimize the area of the converter valve, the U-shaped opening side is connected using an insulator 21, so as to not only meet the insulating requirements between the two modules, but also increase the structural strength, making two independent valve modules jointly constitute one valve layer. As shown in FIG. 2 and FIG. 3, the electrical connections are formed between vertically adjacent valve layers using a busbar 32, and the busbar 32 connect the vertically adjacent valve layers in an oblique manner.

As shown in FIG. 2 and FIG. 3, at least two cooling water pipes are arranged between the upper valve layer and the lower valve layer of the converter valve. Here, four cooling water pipes 41-44 are used, which are in an S-shaped arrangement from top to bottom, that is, the S-shape is connected to the upper valve layer on one end, and is connected to the lower valve layer on the other end. Generally, if two cooling water pipes are provided, one is an inlet pipe, and the other is an outlet pipe. If four cooling water pipes are used, two are inlet pipes, and the other two are outlet pipes. In FIG. 2 and FIG. 3, if cooling water pipes 41, 44 are inlet pipes, cooling water pipes 42, 43 are outlet pipes, or otherwise, if cooling water pipes 42, 43 are inlet pipes, cooling water pipes 41, 44 are outlet pipes. Both the inlet pipes and the outlet pipes are disposed adjacent to the outside. On one hand, electronic components within the valve layer will not be sprayed when a water leakage occurs. On the other hand, this facilitates installation and maintenance for the water pipes.

As shown in FIG. 3, at least two optical cable trays are arranged between the upper valve layer and the lower valve layer of the converter valve. Here, four optical cable trays 71-74 are used as an example, which provide triggering and monitoring approaches for semiconductor devices in the converter valve.

As shown in FIG. 3 and FIG. 4, on the other side of the valve layer opposite to the U-shaped opening side, the busbar 31 is used to make a connection, and the securing connector 22 is disposed, which may be an insulator, or a steel beam, and the like. As such, the valve layer will be formed as a whole, which facilitates hoisting with an overall layer during installation.

Figure 5:
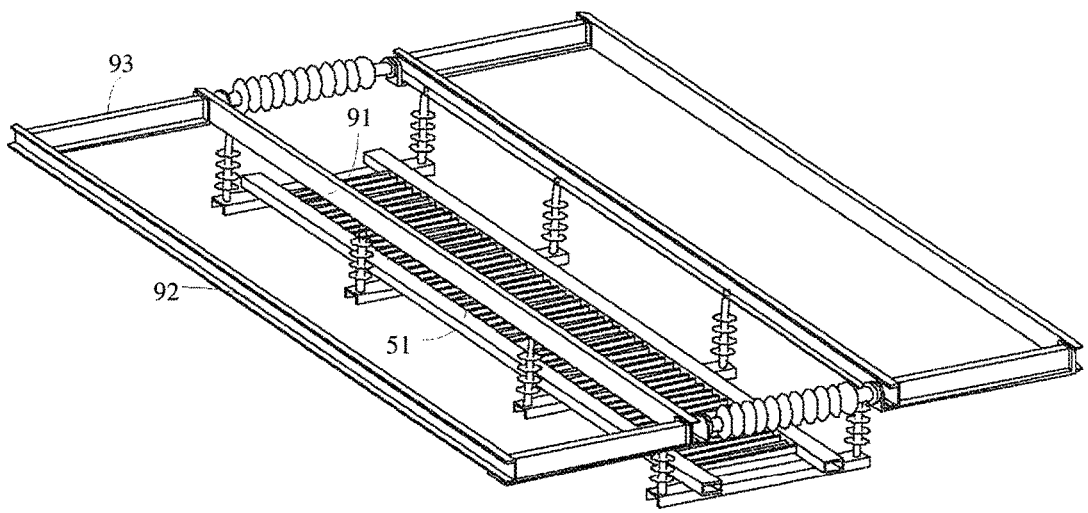
FIG. 5 is a structural schematic diagram of a valve layer frame and a maintenance platform of the converter valve in an application scenario according to an embodiment of the present invention.

As shown in FIG. 5, the frame of each valve module consists of an inner longitudinal beam 91, an outer longitudinal beam 92, and a plurality of (e.g., two shown in FIG. 5) cross beams 93. A plurality of installation holes is evenly provided on the inner longitudinal beam 91 of each half-layer valve. Each of the installation holes is connected to one insulator, and the other end of the insulator is connected to a body 51 of the maintenance platform. The body 51 of the maintenance platform is suspended on the inner longitudinal beams 91 of the two half-layer valves through a plurality of insulators, and the insulators are generally those with umbrella skirts.

In conclusion, in the converter valve according to the embodiment of the present invention, flexible connections and strong shock resistance are achieved between different valve layers through suspension. The two valve modules in the valve layer are secured as a whole, and the insulating distance is not affected by external forces such as earthquake. The valve layer is installed by hoisting with an overall layer, which facilitates operations. In addition, the maintenance platform is suspended on a lower horizontal plane between the two valve modules through insulators, which decreases the size of the valve tower while satisfying an equal creep distance. Moreover, a height difference between the maintenance platform and the valve layer facilitates maintenance of devices on the valve layer by operation and maintenance staff.

The above descriptions are merely preferred embodiments of the present invention and are not intended to limit the scope of protection of the present invention, and various modifications made to the technical solution based on the technical idea of the present invention fall within the scope of protection of the present invention.

What is claimed is:

1. A converter valve, comprising:
    a top shielding cove;
    a bottom shielding cover;
    at least two vertically stacked valve layers; and
    a maintenance platform,
    wherein the top shielding cover is disposed at an upper portion of an uppermost valve layer,
    wherein the bottom shielding cover is disposed at a lower portion of a lowermost valve layer,
    wherein each of the valve layers comprises two valve modules disposed side-by-side in a horizontal direction,
    wherein the two valve modules are electrically connected via a busbar and mechanically connected via securing connectors,
    wherein a lower valve layer is connected to an upper valve layer in a suspended manner,
    wherein a body of the maintenance platform is located between horizontal planes on which two vertically adjacent valve layers are located, or between horizontal planes on which the lowermost valve layer and the bottom shielding cover are located,
    wherein the two valve modules are securely connected via a first securing connector and a second securing connector,
    wherein the first securing connector is composed of an insulating material,
    wherein the second securing connector is an insulator, or an insulating beam, or a metallic beam.

2. The converter valve according to claim 1, wherein the first securing connector and the second securing connector are disposed between the two valve modules, respectively, and adjacent to two opposite side walls of the converter valve.

3. The converter valve according to claim 1, wherein the different valve layers are electrically connected, on one side adjacent to the first securing connector, via the busbars,
    wherein the two valve modules within the same valve layer are electrically connected, on one side adjacent to the second securing connector, via the busbar,
    wherein all the valve modules within the different valve layers in the converter valve are electrically connected in series.

4. The converter valve according to claim 1, wherein the body of the maintenance platform is suspended on frames of two half-layer valves for any valve layer through an insulating material.

5. The converter valve according to claim 1, wherein the frame of the half-layer valve comprises:
    an inner longitudinal beam;
    an outer longitudinal beam;
    at least two cross beams,
    wherein the inner longitudinal beam is a frame of one half-layer valve on one side adjacent to the other half-layer valve,
    wherein the outer longitudinal beam is a frame of the one half-layer valve on one side away from the other half-layer valve, and is parallel to the inner longitudinal beam in a horizontal direction,
    wherein the cross beams are connected between the inner longitudinal beam and the outer longitudinal beam.

6. The converter valve according to claim 1, wherein the body of the maintenance platform is suspended on the inner longitudinal beams of the two half-layer valves.

7. The converter valve according to claim 1, wherein at least two cooling water pipes are provided between the different valve layers.

8. The converter valve according to claim 1, wherein at least two optical cable trays are provided between the different valve layers.

9. The converter valve according to claim 2, wherein the different valve layers are electrically connected, on one side adjacent to the first securing connector, via the busbars,
    wherein the two valve modules within the same valve layer are electrically connected, on one side adjacent to the second securing connector, via the busbar,
    wherein all the valve modules within the different valve layers in the converter valve are electrically connected in series.

10. The converter valve according to claim 4, wherein the frame of the half-layer valve comprises:
    an inner longitudinal beam;
    an outer longitudinal beam;
    at least two cross beams, wherein the inner longitudinal beam is a frame of one half-layer valve on one side adjacent to the other half-layer valve, wherein the outer longitudinal beam is a frame of the one half-layer valve on one side away from the other half-layer valve, and is parallel to the inner longitudinal beam in a horizontal direction, wherein the cross beams are connected between the inner longitudinal beam and the outer longitudinal beam.

11. The converter valve according to claim 5, wherein the body of the maintenance platform is suspended on the inner longitudinal beams of the two half-layer valves.

\* \* \* \* \*